United States Patent
Lee et al.

(10) Patent No.: US 9,809,446 B1
(45) Date of Patent: Nov. 7, 2017

(54) SEMICONDUCTOR PACKAGE AND MANUFACTURING METHOD THEREOF

(71) Applicant: Amkor Technology, Inc., Tempe, AZ (US)

(72) Inventors: Jae Ung Lee, Seoul (KR); Byong Jin Kim, Bucheon-si (KR); Young Seok Kim, Seoul (KR); Wook Choi, Seoul (KR); Seung Jae Yoo, Cheongju-si (KR); Yung Woo Lee, Anyang-si (KR); EunNaRa Cho, Seoul (KR); Dong Hyun Bang, Seoul (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/149,669

(22) Filed: May 9, 2016

(51) Int. Cl.
| | |
|---|---|
| *H01L 23/28* | (2006.01) |
| *H01L 23/31* | (2006.01) |
| *B81B 3/00* | (2006.01) |
| *B81C 1/00* | (2006.01) |
| *H01L 23/00* | (2006.01) |
| *H01L 21/56* | (2006.01) |

(52) U.S. Cl.
CPC ........ *B81B 3/0072* (2013.01); *B81C 1/00666* (2013.01); *H01L 21/568* (2013.01); *H01L 23/28* (2013.01); *H01L 23/3121* (2013.01); *H01L 23/3135* (2013.01); *H01L 24/83* (2013.01); *H01L 24/97* (2013.01)

(58) Field of Classification Search
CPC . H01L 2224/73265; H01L 2224/48227; H01L 2224/32225; H01L 2224/32145; H01L 2224/48247; H01L 2924/181; H01L 25/0657; H01L 2224/83; H01L 2224/48479; H01L 2224/48257; H01L 24/83; H01L 24/97; H01L 2224/0401; H01L 2224/04042; H01L 21/568; H01L 2224/04105; H01L 2224/85; H01L 23/3135; H01L 2224/73253; H01L 2225/06506; H01L 23/3121; H01L 24/85; H01L 24/96; H01L 21/56; B81B 3/0072; B81C 1/00666

USPC ........................................................ 257/668
See application file for complete search history.

(56) References Cited

U.S. PATENT DOCUMENTS

| | | | |
|---|---|---|---|
| 6,593,662 B1* | 7/2003 | Pu | H01L 23/4334 257/668 |
| 2006/0017156 A1* | 1/2006 | Reiss | H01L 24/32 257/712 |
| 2010/0066307 A1* | 3/2010 | Kim | H01M 10/42 320/134 |
| 2014/0027867 A1* | 1/2014 | Goida | H01L 23/3675 257/416 |

* cited by examiner

*Primary Examiner* — Caleen Sullivan
(74) *Attorney, Agent, or Firm* — McAndrews, Held & Malloy, Ltd.

(57) ABSTRACT

A semiconductor package and a method of manufacturing a semiconductor package. As a non-limiting example, various aspects of this disclosure provide a semiconductor package, and a method of manufacturing thereof, that comprises a first semiconductor die, a plurality of adhesive regions spaced apart from each other on the first semiconductor die, and a second semiconductor die adhered to the plurality of adhesive regions.

22 Claims, 8 Drawing Sheets

SEMICONDUCTOR PACKAGE AND MANUFACTURING METHOD THEREOF

BACKGROUND

Present semiconductor devices and methods for manufacturing semiconductor devices are inadequate, for example resulting in too-low sensitivity, excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1A:
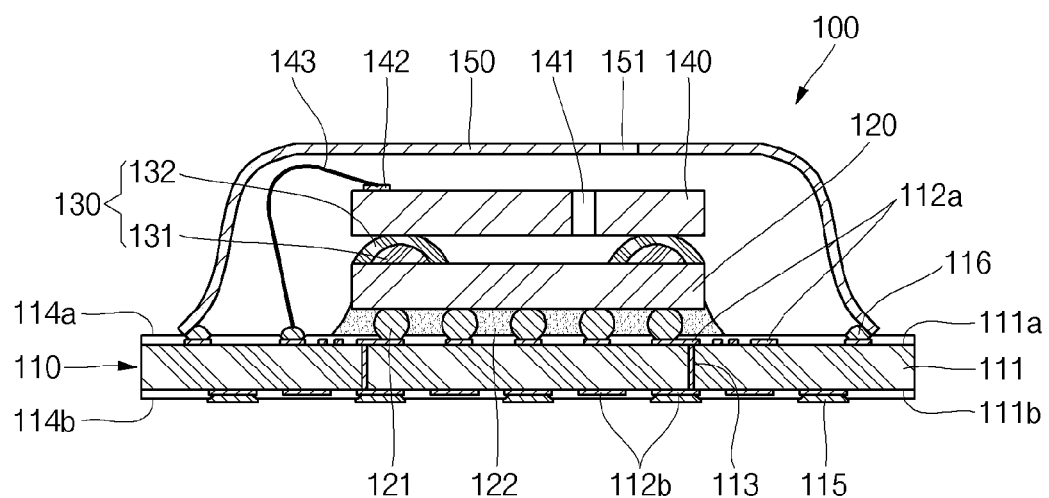
FIGS. 1A and 1B are a cross-sectional view and a partially cut-away plan view of a semiconductor device with high sensitivity according to various aspects of the present disclosure.

Various aspects of this disclosure provide a semiconductor package and a method of manufacturing a semiconductor package. As a non-limiting example, various aspects of this disclosure provide a semiconductor package, and a method of manufacturing thereof, that comprises a first semiconductor die, a plurality of adhesive regions spaced apart from each other on the first semiconductor die, and a second semiconductor die adhered to the plurality of adhesive regions.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Certain embodiments of the disclosure relate to a semiconductor device with high sensitivity and a manufacturing (or fabricating) method thereof.

In general, a micro-electro-mechanical systems (MEMS) package means a system having many electronic circuits and mechanical components integrated on the same chip. Techniques for fabricating the MEMS package originated from silicon processing techniques for fabricating semiconductor chips. The MEMS package is fabricated in a three-dimensional structure having micromachined components, including for example a valve, a motor, a pump, a gear and/or a diaphragm, integrated on a silicon substrate. Though a MEMS package may be utilized in various examples provided herein, the scope of the present disclosure is not limited to MEMS packages.

According to an aspect of the present disclosure, there is provided a semiconductor device including a circuit board, a first semiconductor die electrically connected to the circuit board, a plurality of adhesive regions spaced apart from each other on the first semiconductor die, a second semiconductor die adhered to the plurality of adhesive regions and electrically connected to the circuit board, and a case adhered to the circuit board while covering the first semiconductor die, the adhesive regions and the second semiconductor die.

According to another aspect of the present disclosure, there is provided a semiconductor device including a first semiconductor die, a plurality of adhesive regions spaced apart from each other on the first semiconductor die, and a second semiconductor die adhered to the plurality of adhesive regions.

According to still another aspect of the present disclosure, there is provided a fabricating method of a semiconductor device, the fabricating method including preparing a circuit board, electrically connecting a first semiconductor die to the circuit board, forming a plurality of adhesive regions spaced apart from each other on the first semiconductor die, adhering a second semiconductor die to the plurality of adhesive regions and electrically connecting the second semiconductor die to the circuit board, and adhering a case to the circuit board to cover the first semiconductor die, the adhesive regions and the second semiconductor die.

Figure 1B:
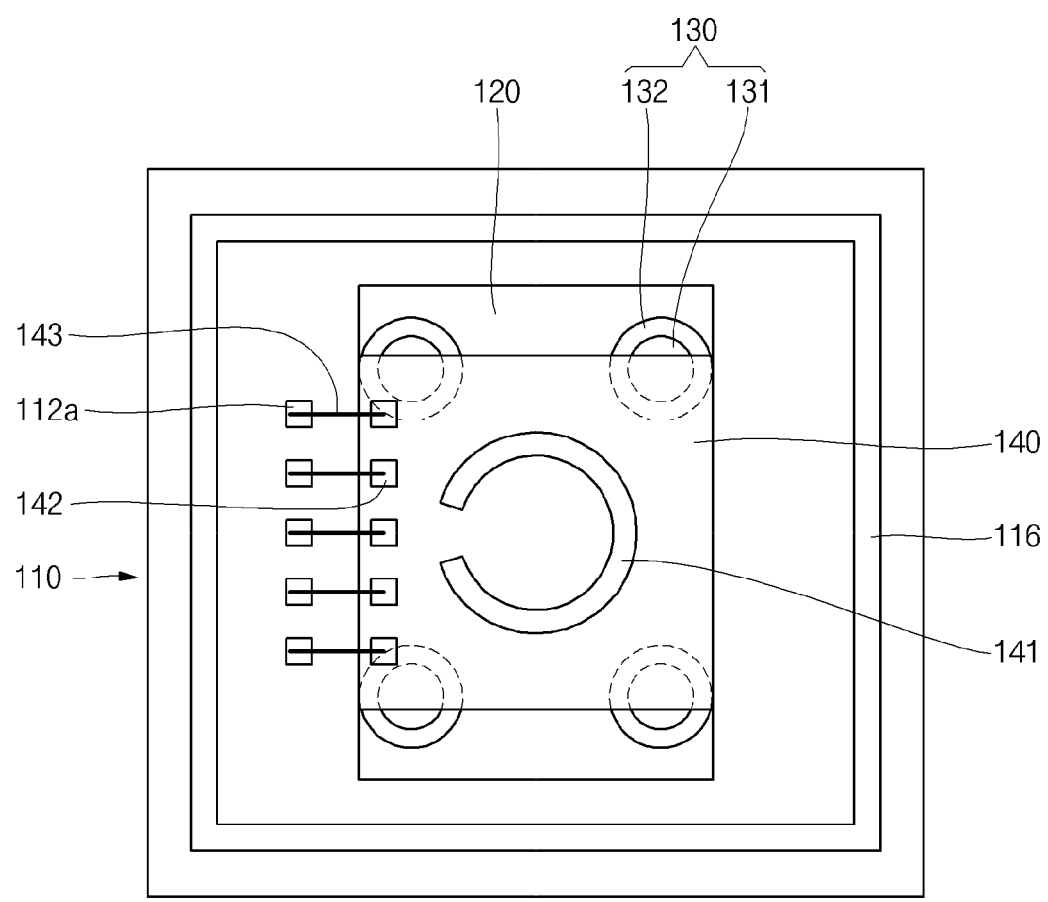

Referring to FIGS. 1A and 1B, a cross-sectional view and a partially cut-away plan view of a semiconductor device with high sensitivity according to various aspects of the present disclosure are illustrated.

As illustrated in FIGS. 1A and 1B, the semiconductor device 100 with high sensitivity according to various aspects of the present disclosure includes a circuit board 110, a first semiconductor die 120, a plurality of adhesive regions 130, a second semiconductor die 140, and a case 150.

Here, the first semiconductor die 120 may be electrically connected to the circuit board 110 by, for example, conductive bumps 121, and the second semiconductor die 140 may be electrically connected to the circuit board 110 by, for example, conductive wires 143.

The circuit board 110 may include, for example, an insulation layer 111 (or dielectric layer) having a substantially planar first surface 111a and a substantially planar second surface 111b opposite to the first surface 111a, first circuit patterns 112a formed on the first surface 111a of the insulation layer 111, second circuit patterns 112b formed on the second surface 111b of the insulation layer 111, and conductive vias 113 connecting the first circuit patterns 112a and the second circuit patterns 112b to each other. Note that the circuit board 110 is merely an example, and any of a variety of substrate structures may be utilized (e.g., cored and coreless substrates, interposer structures, single or multi-layer redistribution structures, etc.).

Here, the first surface 111a of the insulation layer 111 and the first circuit patterns 112a may be covered by, for example, a first protection layer 114a (or dielectric layer), and the second surface 111b of the insulation layer 111 and the second circuit patterns 112b may be covered by, for example, a second protection layer 114b (or dielectric layer).

Meanwhile, a predetermined circuit pattern of the first circuit patterns 112a may be electrically connected to, for example, the first semiconductor die 120, another predetermined circuit pattern of the first circuit patterns 112a may be electrically connected to, for example, the second semiconductor die 140, and still another predetermined circuit pattern of the first circuit patterns 112a may be mechanically and/or electrically connected to, for example, the case 150.

A conductive adhesive layer 116, for example, may be formed on the first circuit pattern 112a connected to the case 150. When viewed from a plane, the conductive adhesive layer 116 may have a substantially rectangular ring, for example, (see FIG. 1B). To this end, when viewed from a plane, the first circuit pattern 112a (or portion thereof) adhered to the case 150 may also have a substantially rectangular ring, for example.

In addition, conductive lands 115 may be formed on particular circuit patterns of the second circuit patterns 112b and may later be mounted on an external device. Since the conductive lands 115 have smaller thicknesses than general conductive balls, the overall thickness of the semiconductor device 100 can be reduced.

Here, the conductive lands 115 may be, for example, one of a nickel/gold (Ni/Au) plated layer, a nickel/palladium/gold (Ni/Pd/Au) plated layer, a solder plated layer, and equivalents thereof, formed on the second circuit patterns 112b, but aspects of the present disclosure are not limited thereto. Instead of the conductive lands 115, conductive balls or bumps may be connected to the particular circuit patterns of the second circuit patterns 112b.

The first semiconductor die 120 is electrically connected to the first circuit patterns 112a of the circuit board 110. That is to say, the first semiconductor die 120 may include one or more conductive bumps 121, which are electrically connected to the first circuit patterns 112a. The conductive bumps 121 may be, for example, one of copper pillars, copper pillars or posts having solder caps, conductive balls, solder balls and equivalents thereof, but aspects of the present disclosure are not limited thereto.

The first semiconductor die 120 may include a digital signal processor (DSP), a network processor, a power management unit, an audio processor, a radio frequency (RF) circuit, a wireless baseband system on chip (SoC) processor, a sensor, a sensor controller, and an electric circuit, such as application specific integrated circuit (ASIC), but the scope of the present disclosure is not limited thereto.

In addition, an underfill 122 may fill a gap between the first semiconductor die 120 and the circuit board 110. That is to say, the conductive bumps 121 may be surrounded by the underfill 122. Therefore, it is possible to prevent the conductive bumps 121 from being cracked or damaged by a difference between coefficients of thermal expansion of the first semiconductor die 120 and the circuit board 110.

The plurality of adhesive regions 130 may be formed on the first semiconductor die 120 to be horizontally spaced apart from each other. As an example, the plurality of adhesive regions 130 may be formed at corners of the first semiconductor die 120. The plurality of adhesive regions 130 may be formed on a first adhesive region 131 formed on the first semiconductor die 120 and a second adhesive region 132 formed on the first semiconductor die 120 and adhered to the second semiconductor die 140 while covering (e.g., fully covering, partially covering, covering at least a top portion of, etc.) the first adhesive region 131. Note that the second adhesive region 132 need not be centered on the first adhesive region 131.

Practically, the first adhesive region 131 may be formed on the first semiconductor die 120 to have a substantially hemispherical shape and a surface of the first adhesive region 131 may be covered by the second adhesive region 132 (e.g., fully covered by, partially covered by, at least a top portion covered by, etc.). Therefore, the second adhesive region 132 may also be formed to have a substantially hemispherical shape. Practically, the first adhesive region 131 (for example, a liquid adhesive) may first be dispensed on a top surface of the first semiconductor die 120 to then be cured and the second adhesive region 132 (for example, a liquid adhesive) may then be dispensed on the first adhesive region 131. Then, after the second semiconductor die 140 is mounted on the second adhesive region 132, the second adhesive region 132 is cured, so that the second semiconductor die 140 is adhered to the first semiconductor die 120 through the second adhesive region 132. That is to say, the second semiconductor die 140 is adhered onto the first semiconductor die 120 through the adhesive regions 130 in a state in which it floats above (e.g., with a gap between the top surface of the first semiconductor die 120 and the bottom surface of the second semiconductor die 140).

Each of the plurality of adhesive regions 130 may have a thickness in a range of approximately 10 µm to approximately 50 µm. If the thicknesses of the adhesive regions 130 are less than 10 µm, the semiconductor device 100 may have lowered sensitivity. However, if the thicknesses of the adhesive regions 130 are greater than 50 µm, it may be generally more difficult to fabricate the semiconductor device 100 and the thickness of the semiconductor device 100 may increase. Here, the first adhesive region 131 may have a thickness in a range of approximately 5 µm to approximately 25 µm and the second adhesive region 132 may have a thickness in a range of approximately 5 µm to approximately 25 µm.

The plurality of adhesive regions 130 may be at least one of a plastomer, an elastomer, a thermoplastic elastomer, a thermosetting resin, a photo-curable resin, and equivalents thereof, but the scope of the present disclosure is not limited thereto. For example, the plurality of adhesive regions 130 may be a silicone base thermosetting epoxy resin. In addition, the first adhesive region 131 and the second adhesive region 132 may be made of different materials or the same material. The adhesive regions 130 may, for example, be non-conductive.

In particular, the first adhesive region 131 and the second adhesive region 132 may have different moduli. For example, the modulus of the first adhesive region 131 may be relatively high and the modulus of the second adhesive region 132 may be relatively low. That is to say, the modulus of the first adhesive region 131 may be higher than that of the second adhesive region 132, or the modulus of the second adhesive region 132 may be lower than that of the first adhesive region 131. In other words, since the first adhesive region 131 is relatively hard (or stiff), it can stably support the second semiconductor die 140. However, since the second adhesive region 132 is relatively soft (or compliant), it allows external stress applied to the second semiconductor die 140 to be easily released, thereby improving the sensitivity of the second semiconductor die 140.

The second semiconductor die 140 is adhered to the plurality of adhesive regions 130 and is electrically connected to the circuit board 110. That is to say, the second semiconductor die 140 may be directly adhered to the second adhesive region 132 among the plurality of adhesive regions 130 (e.g., without being in direct contact with the first adhesive region 131, etc.) and may be electrically connected to the first circuit patterns 112a of the circuit board 110 by the conductive wires 143 (e.g., bond wires, etc.).

The second semiconductor die 140 may include a MEMS device, or may include any of a variety of semiconductor devices, many examples of which are provided herein. The MEMS device may include a through-hole 141. For example, the second semiconductor die 140 may be one of a pressure sensor for sensing an external pressure, a microphone for sensing a sound wave, a moisture sensor, a particle or gas sensor, and equivalents thereof, but aspects of the present disclosure are not limited thereto.

Meanwhile, the second semiconductor die 140 has a substantially planar bottom surface, which is brought into direct contact with the second adhesive region 132 of the adhesive regions 130 (e.g., without being in direct contact with the first adhesive region 131 of the adhesive regions 130). Note that in various example embodiments, the bottom surface of the second semiconductor die 140 may contact the first adhesive region 131, for example if pressed upon the first adhesive region 131 before the adhesive of the second adhesive region is cured.

For example, approximately 5% to approximately 30% of the bottom surface of the second semiconductor die 140 may be adhered to the adhesive regions 130. That is to say, approximately 95% to approximately 70% of the bottom surface of the second semiconductor die 140 may be directly exposed to the external air. When less than 5% of the bottom surface of the second semiconductor die 140 is adhered to the adhesive regions 130, the second semiconductor die 140 may, for example, not be firmly adhered onto the first semiconductor die 120. In addition, when more than 30% of the bottom surface of the second semiconductor die 140 is adhered to the adhesive regions 130, the sensitivity of the second semiconductor die 140 may be lowered.

The conductive wires 143 electrically connect the first circuit patterns 112a of the circuit board 110 to the second semiconductor die 140. Here, the conductive wires 143 are first ball-bonded to the first circuit patterns 112a of the circuit board 110 and are secondly stitch-bonded to bond pads 142 of the second semiconductor die 140, thereby minimizing the height of a wire loop.

The case (or cover) 150 is mechanically connected to the conductive adhesive layer 116 formed on the first circuit patterns 112a of the circuit board 110. Here, the case 150 includes at least one through-hole 151, for example allowing the pressure or sound wave or air to be easily transmitted to the second semiconductor die 140. In addition, the case 150 may be made of a metal. The case 150 may be made of, for example, one of copper, aluminum, nickel plated iron and equivalents thereof, but the scope of this disclosure is not limited thereto. In addition, the case 150 may be grounded through, for example, the conductive adhesive layer 116 and the first circuit patterns 112a.

In addition, spaces are provided in an interior region of the case 150, that is, between each of the first semiconductor die 120, the plurality of adhesive regions 130, the second semiconductor die 140 and the case 150, and the conductive wires 143 may be directly exposed to, for example, the air.

Additionally, an insulation layer may further be formed on the internal surface of the case 150, thereby preventing the conductive wires 143 from being electrically shorted. For example, one of bismaleimidetriazine (BT), a phenolic resin, polyimide (PI), benzocyclobutene (BCB), polybenzoxazole (PBO), epoxy and equivalents thereof and mixtures thereof, may be coated on the internal surface of the case 150, so that the conductive wires 143 may not be electrically shorted to the case 150.

Additionally, an absorbent that absorbs or adsorbs moisture, such as silica gel, activated alumina or calcium chloride, may further be coated on the internal surface of the case 150, thereby preventing moisture penetrating into the case 150 from affecting the performance of the second semiconductor die 140.

The absorbent may be mixed with the insulation layer to then be coated on the internal surface of the case 150.

In some instances, the case 150 may be made of an insulating material. Here, the case 150 may be adhered to the circuit board 110 using an insulating (or non-conductive) adhesive.

As illustrated in FIG. 1B, each of the plurality of adhesive regions 130 may include the first adhesive region 131 and the second adhesive region 132, which may be arranged at corners of the first semiconductor die 120 and/or the second semiconductor die 140. When viewed in a plane (or plan view), if the second semiconductor die 140 has a smaller size than the first semiconductor die 120, the adhesive regions 130 may slightly bleed out to the outside of the second semiconductor die 140. However, if the size of the second semiconductor die 140 is equal to or smaller than that of the first semiconductor die 120, the plurality of adhesive regions 130 are preferably formed at inner areas than the corners of the first semiconductor die 120 and the second semiconductor die 140 to prevent the adhesive regions 130 from bleeding out, when viewed in a plane (or plan view).

As described above, in the semiconductor device 100 according to various aspects of the present disclosure, since the second semiconductor die 140 is adhered onto the first semiconductor die 120 by the plurality of adhesive regions 130 spaced apart from each other and having a predetermined thickness, the sensitivity of the second semiconductor die 140 is improved. That is to say, since the second semiconductor die 140 is spaced a predetermined height (approximately 10 μm to approximately 50 μm) apart (or floats) from the first semiconductor die 120, and the plurality of adhesive regions 130 adhering the second semiconductor die 140 to the first semiconductor die 120 are spaced a predetermined distance apart from each other, the sensitivity of the second semiconductor die 140 with respect to the external pressure or sound wave can be improved.

Additionally, the plurality of spaced-apart adhesive regions 130 may improve radiation performance of external stress applied to the second semiconductor die 140 and may suppress electrical noises.

Referring to FIGS. 2A to 2F, plan views illustrating various adhesive dispensing regions in a semiconductor device with high sensitivity according to various aspects of the present disclosure are illustrated.

Figure 2A:
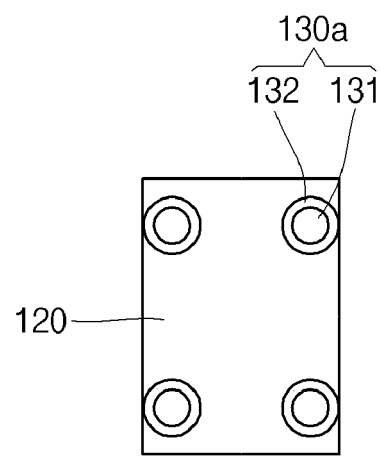
FIGS. 2A to 2F are plan views illustrating various adhesive dispensing regions in a semiconductor device with high sensitivity according to various aspects of the present disclosure.
Figure 2B:
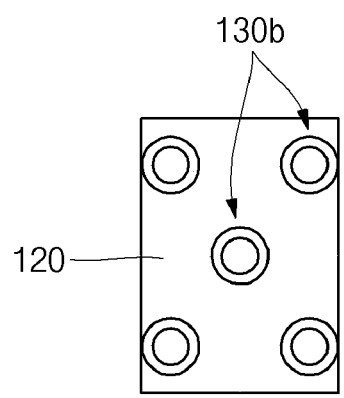
Figure 2C:
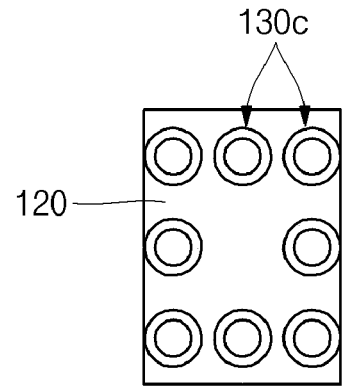
Figure 2D:
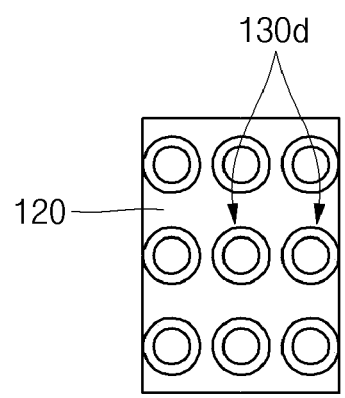
Figure 2E:
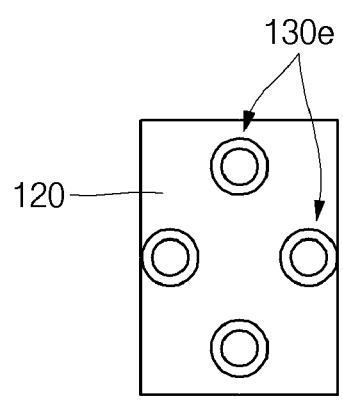
Figure 2F:
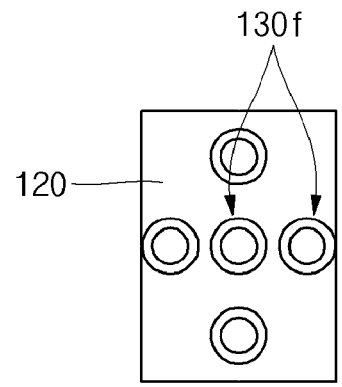

As illustrated in FIG. 2A, adhesive regions 130*a* may be arranged (or positioned) roughly at four corners of the first semiconductor die 120. As illustrated in FIG. 2B, adhesive regions 130*b* may be arranged roughly at four corners and roughly at the center of the first semiconductor die 120. As illustrated in FIG. 2C, adhesive regions 130*c* may be arranged roughly along four sides of the first semiconductor die 120. As illustrated in FIG. 2D, adhesive regions 130*d* may be arranged roughly at four sides and at the center of the first semiconductor die 120. As illustrated in FIG. 2E, adhesive regions 130*e* may be arranged roughly at centers of four sides of the first semiconductor die 120. As illustrated in FIG. 2F, adhesive regions 130*f* may be arranged roughly at centers of four sides and at the center of the first semiconductor die 120. Note that in any of the example illustrations herein showing adhesive regions 130 with respect to the first semiconductor die 120, the second semiconductor die 140 may be substituted for the first semiconductor die 120 to show example adhesive region 130 placements with respect to the second semiconductor die 140.

The arrangement patterns of the adhesive regions 130*a* to 130*f* are provided by way of examples for a better understanding of the present disclosure, and the adhesive regions 130*a* to 130*f* may be arranged in various other manners, although not illustrated herein. However, each of the adhesive regions 130*a* to 130*f* should include the first adhesive region 131 and the second adhesive region 132 covering the first adhesive region 131 and the adhesive regions 130*a* to 130*f* should be spaced a predetermined distance apart from each other, thereby improving the sensitivity of the second semiconductor die 140 adhered onto the adhesive regions 130*a* to 130*f*.

Figure 3:
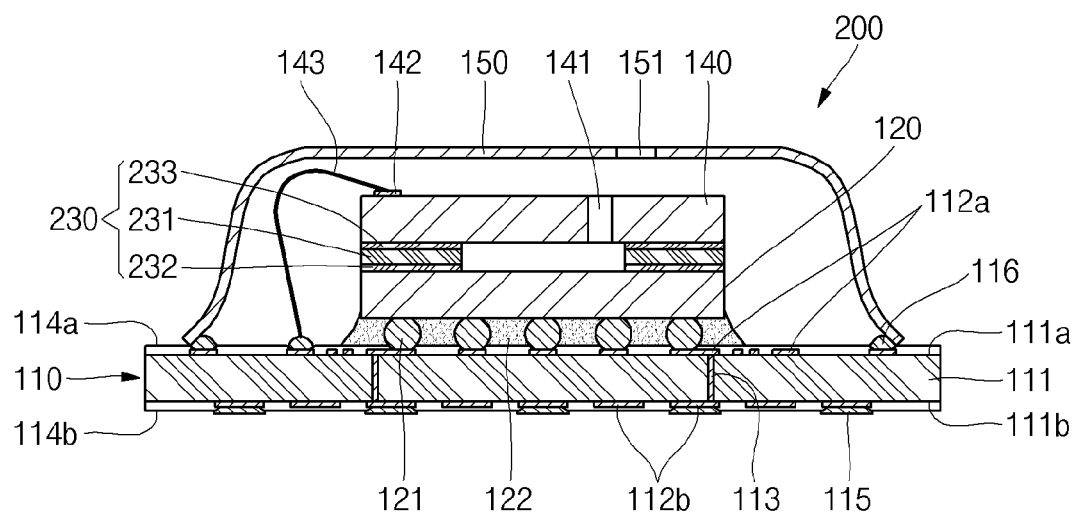
FIG. 3 is a cross-sectional view of a semiconductor device with high sensitivity according to another embodiment of the present disclosure.

Referring to FIG. 3, a cross-sectional view a semiconductor device with high sensitivity according to another embodiment of the present disclosure is illustrated.

As illustrated in FIG. 3, the semiconductor device 200 with high sensitivity according to another embodiment of the present disclosure may include adhesive regions 230 in forms of films. For example, the adhesive regions 230 may include a central elastomer 231, a first adhesive layer 232 formed on a bottom surface of the elastomer 231 and adhered to the first semiconductor die 120, and a second adhesive layer 233 formed on a top surface of the elastomer 231 and adhered to the second semiconductor die 140.

The film-type adhesive regions 230 may first be adhered to the first semiconductor die 120 and the second semiconductor die 140 may then be adhered to the first semiconductor die 120. Alternatively, the film-type adhesive regions 230 may first be adhered to a bottom surface of the second semiconductor die 140 and the first semiconductor die 120 may then be adhered to a bottom surface of the second semiconductor die 140.

Since the central elastomer 231 has a smaller modulus than the first and second adhesive layers 232 and 233, the sensitivity of the second semiconductor die 140 may not be lowered by the central elastomer 231. That is to say, since the modulus of the central elastomer 231 is relatively low, external stress applied to the second semiconductor die 140 can be easily released. In addition, since the moduli of the first and second adhesive layers 232 and 233 are relatively high, the first and second adhesive layers 232 and 233 can be firmly adhered to the central elastomer 231.

Meanwhile, the film-type adhesive regions 230 may, for example, have all features (e.g., placements, etc.) of the aforementioned adhesive regions 130 and 130*a* to 130*f* illustrated in FIGS. 1A, 1B and 2A to 2F.

As described above, in the semiconductor device 200 with high sensitivity according to another embodiment of the present disclosure, since the plurality of adhesive regions 230 spaced a predetermined distance apart from each other and having a predetermined thickness are also formed between the first semiconductor die 120 and the second semiconductor die 140, the sensitivity of the second semiconductor die 140 can be improved. In addition, since the adhesive regions 230 of the semiconductor device 200 require a single curing process, the fabricating process of the semiconductor device 200 can be simplified.

Referring to FIGS. 4A to 4I, cross-sectional views illustrating a fabricating method of a semiconductor device with high sensitivity according to various aspects of the present disclosure are illustrated.

The fabricating method of the semiconductor device 100 with high sensitivity according to various aspects of the present disclosure includes preparing a circuit board, connecting a first semiconductor die, forming adhesive regions, connecting a second semiconductor die, and attaching a case, and singulating.

Figure 4A:
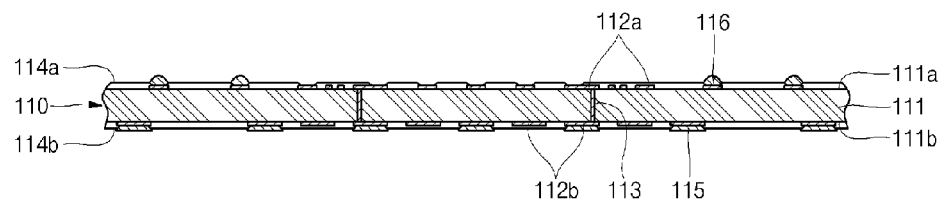
FIGS. 4A to 4I are cross-sectional views illustrating a fabricating method of a semiconductor device with high sensitivity according to various aspects of the present disclosure.

As illustrated in FIG. 4A, in the preparing of circuit board, the circuit board 110 is prepared, the circuit board 110 including an insulation layer 111 having a substantially planar first surface 111*a* and a substantially planar second surface opposite to the first surface 111a, first circuit patterns 112a formed on the first surface 111a of the insulation layer 111, second circuit patterns 112b formed on the second surface 111b of the insulation layer 111, and conductive vias 113 connecting the first circuit patterns 112a and the second circuit patterns 112b to each other. As discussed herein, any of a variety of substrates may be utilized instead of (or in addition to) a circuit board.

Here, a conductive adhesive layer 116 having a predetermined thickness may be pre-formed on a region of the first circuit pattern 112a, to which the case 150 is to be attached later.

In addition, regions of the first circuit patterns 112a, to which conductive bumps 121 and/or conductive wires 143 are to be connected later, may be exposed to the outside through a first protection layer 114a.

Additionally, conductive lands 115 may be pre-formed on regions of the second circuit patterns 112b, which are to be connected to an external device later. For example, instead of the conductive lands 115, conductive balls may be formed on the second circuit patterns 112b, prior to the singulating.

Figure 4B:
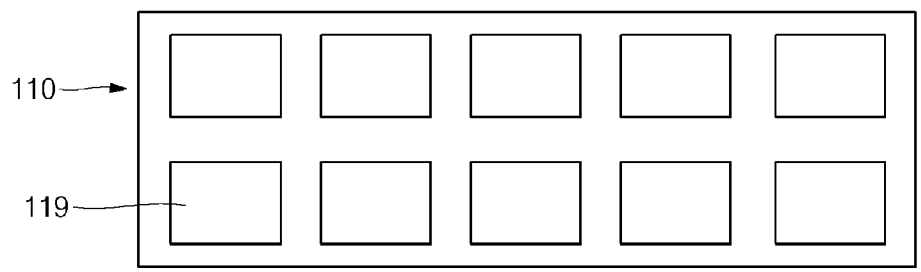

As illustrated in FIG. 4B, the circuit board 110 may include units 119 arranged in a matrix configuration, where the semiconductor device 100 is to be formed. After the fabricating of the semiconductor device 100 is completed, the respective units 119 are singulated to be divided into individual devices.

Figure 4C:
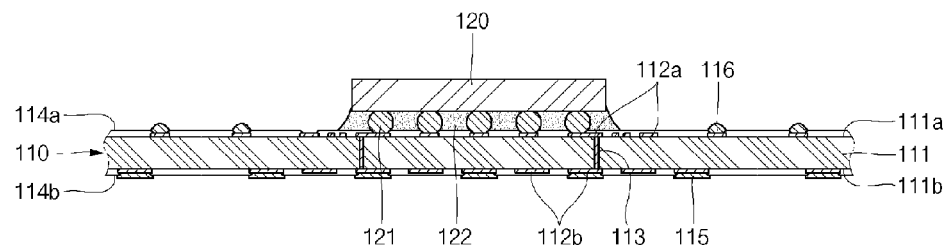

As illustrated in FIG. 4C, in the connecting of first semiconductor die, conductive bumps 121 are formed on the first semiconductor die 120 and are electrically connected to the first circuit patterns 112a of the circuit board 110. The first semiconductor die 120 may be electrically connected to the first circuit patterns 112a of the circuit board 110 by, for example, one of mass reflowing, thermally compressive bonding, laser assisted bonding, and equivalents thereof, but the scope of this disclosure is not limited thereto. Here, the conductive bumps 121 may be made of, for example, one of eutectic solder (Sn37Pb), high lead solder (Sn95Pb), lead-free solder, such as SnAg, SnAu, SnCu, SnZn, SnZnBi, SnAgCu, SnAgBi, etc., and equivalents thereof, but aspects of the present disclosure are not limited thereto.

Additionally, an underfill 122 may further be injected into a gap between the first semiconductor die 120 and the circuit board 110, thereby allowing the first semiconductor die 120 to be more stably connected to the circuit board 110.

Figure 4D:
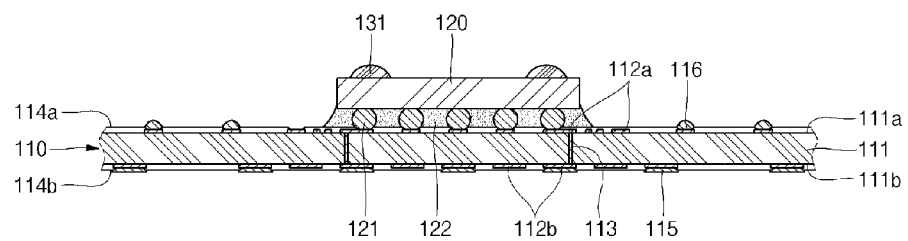
Figure 4E:
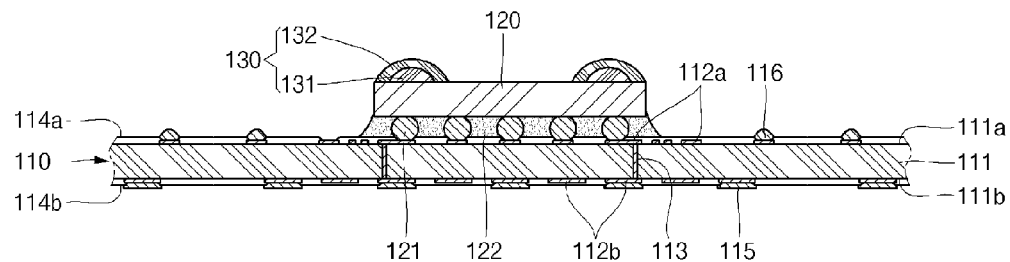

As illustrated in FIGS. 4D and 4E, in the forming of adhesive regions, a plurality of adhesive regions 130 spaced apart from each other are formed on the first semiconductor die 120. For example, a first adhesive region 131 is first formed on the first semiconductor die 120 to then be cured rigidly. In addition, a second adhesive region 132 is secondly formed on the first adhesive region 131. Here, while a curing process is performed on the first adhesive region 131, no curing process is performed on the second adhesive region 132. In such a manner, the first adhesive region 131 is first formed and cured, thereby exhibiting reduced bleed-out in the second adhesive region 132 due to the weight of the second semiconductor die 140.

Figure 4F:
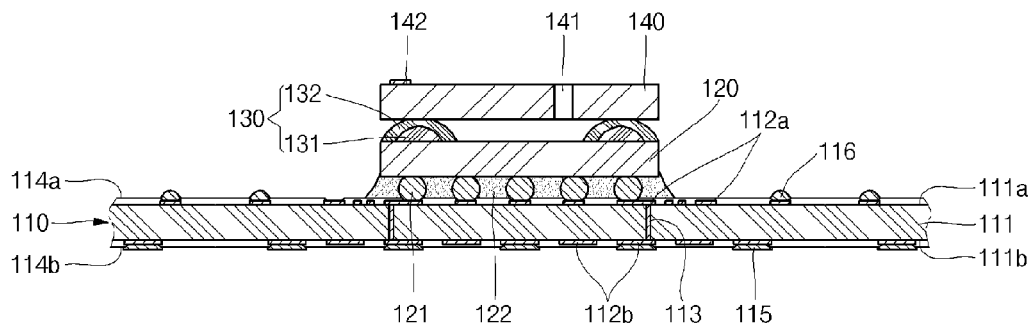
Figure 4G:
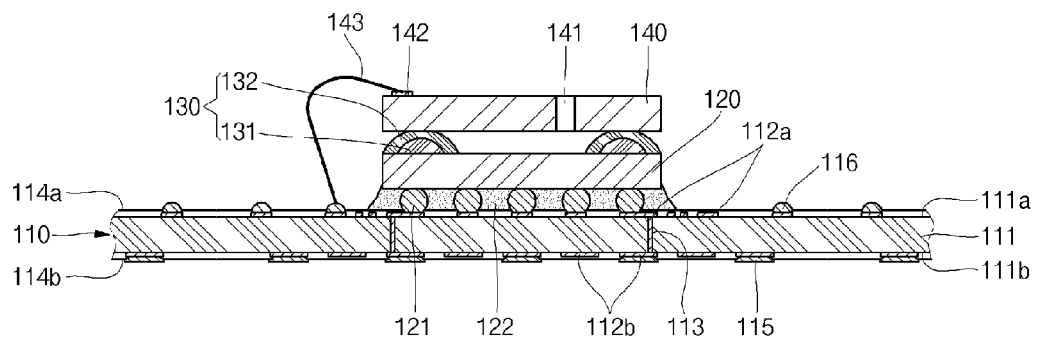

As illustrated in FIGS. 4F and 4G, in the connecting of second semiconductor die, the second semiconductor die 140 (for example, a MEMS device, or any of a variety of types of semiconductor device) is adhered to the plurality of adhesive regions 130. Here, while the first adhesive region 131 of the adhesive regions 130 is cured, the second adhesive region 132 is yet to be cured. Therefore, after the second semiconductor die 140 is placed on the second adhesive region 132 using pick-and-place equipment, the curing process is performed. When the second adhesive region 132 is made of a thermosetting resin, a temperature in a range of, for example, approximately 100° C. to approximately 350° C., is applied to the second adhesive region 132. When the second adhesive region 132 is a photo-curable resin, UV ray, for example, may be applied to the second adhesive region 132. In such a manner, the second semiconductor die 140 is mechanically adhered to the first semiconductor die 120 through the plurality of adhesive regions 130.

In addition, the second semiconductor die 140 is electrically connected to the circuit board 110 by conductive wires 143. That is to say, bond pads 142 of the second semiconductor die 140 are electrically connected to the first circuit patterns 112a of the circuit board 110 by the conductive wires 143.

As an example, first ends of the conductive wires 143 are first ball-banded to the first circuit patterns 112a of the circuit board 110 and second ends of the conductive wires 143 are secondly stitch-bonded to the bond pads 142 of the second semiconductor die 140. Accordingly, the height of a wire loop of each of the conductive wires 143 is minimized, thereby minimizing the thickness of the semiconductor device 100.

Figure 4H:
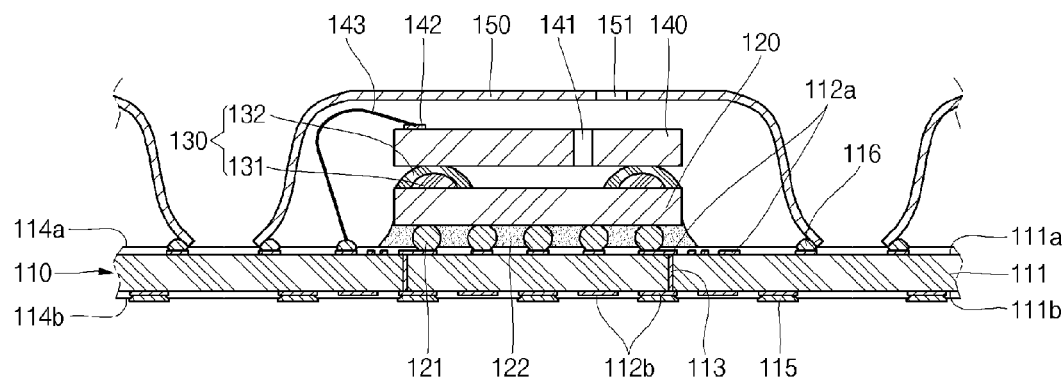

As illustrated in FIG. 4H, in the attaching of case, the case 150 (or cover) having a through-hole 151 is connected to the conductive adhesive layer 116 previously formed on the circuit board 110. That is to say, after the case 150 made of a metal is placed on the conductive adhesive layer 116, a temperature in a range of, for example, approximately 100° C. to approximately 250° C., is applied to mechanically and/or electrically connect the metal case 150 to the conductive adhesive layer 116. Here, the first circuit patterns 112a having the conductive adhesive layer 116 may be grounded.

Figure 4I:
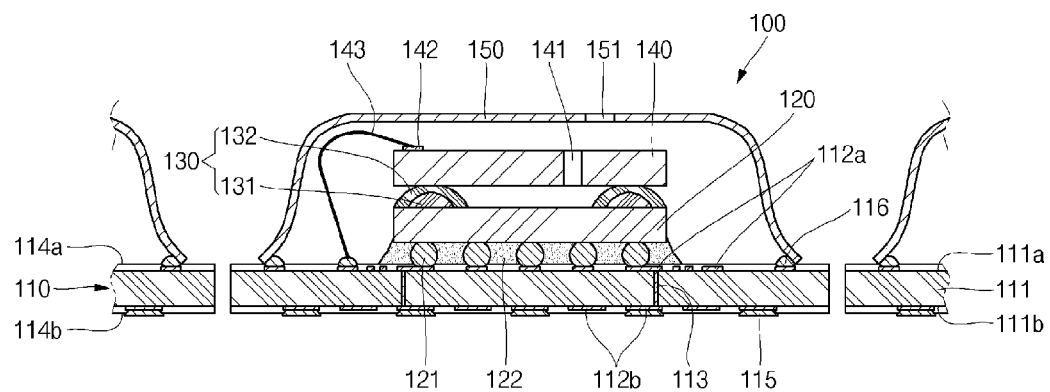

As illustrated in FIG. 4I, in the singulating, a plurality of semiconductor devices 100 are separated from the circuit board 110. As described above, the circuit board 110 includes a plurality of units, and the semiconductor device 100 is formed in each of the plurality of units. Therefore, after the fabricating of the semiconductor device 100 is completed, individual semiconductor devices 100 are separated from the circuit board 110 using, for example, a diamond blade, a punch or laser beam.

As described above, in a semiconductor device with high sensitivity and the fabricating method thereof according to an embodiment of the present disclosure, a MEMS device (or other semiconductor die or electrical component) is adhered onto a plurality of adhesive regions spaced apart from each other on a circuit board or a semiconductor die and having a predetermined thickness, so that the MEMS device is configured to substantially float in the air. Therefore, external stress applied to the MEMS device can be more efficiently reduced, thereby suppressing electrical noises. In addition, the adhesive regions include a first adhesive region and a second adhesive region covering the first adhesive region, thereby exhibiting reduced bleed-out in the adhesive regions due to the weight of the MEMS device.

The discussion herein included numerous illustrative figures that showed various portions of an electronic package assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor device and a method of manufacturing a semiconductor device. As a non-limiting example, various aspects of this disclosure provide a semiconductor package, and a method of manufacturing thereof, that comprises a first semiconductor die, a plurality of adhesive regions spaced apart from each other on the first semiconductor die, and a second semiconductor die adhered to the plurality of adhesive regions. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device comprising:
   a substrate;
   a first semiconductor die having a top first die surface and a bottom first die surface, wherein the bottom first die surface is coupled to the substrate, and the first semiconductor die is electrically connected to the substrate;
   a plurality of adhesive regions spaced apart from each other on the top first die surface; and
   a second semiconductor die having a top second die surface and a bottom second die surface, wherein the bottom second die surface is adhered to the plurality of adhesive regions, and the second semiconductor die is electrically connected to the substrate,
   wherein each of the adhesive regions comprises only adhesive material and bridges an entire vertical gap between the top first die surface and the bottom second die surface.

2. The semiconductor device of claim 1, wherein the substrate is a circuit board.

3. The semiconductor device of claim 1, wherein the volume directly between the first semiconductor die and the second semiconductor die comprises only the plurality of adhesive regions and air.

4. The semiconductor device of claim 1, wherein at least a portion of the plurality of adhesive regions are positioned at corners of the first semiconductor die and/or the second semiconductor die.

5. The semiconductor device of claim 1, wherein at least a portion of the plurality of adhesive regions are positioned along sides of the first semiconductor die and/or the second semiconductor die, at midpoints of the sides.

6. The semiconductor device of claim 1, wherein at least one of the plurality of adhesive regions is formed at the center of the first semiconductor die and/or the second semiconductor die.

7. The semiconductor device of claim 1, wherein each of the plurality of adhesive regions has a vertical thickness in a range of 10 µm to 50 µm.

8. The semiconductor device of claim 1, wherein the adhesive regions are made of at least one of: a plastomer, an elastomer, a thermoplastic elastomer, a thermosetting resin, and a photo-curable resin.

9. The semiconductor device of claim 1, wherein each of the plurality of adhesive regions comprises:
   a first adhesive region on and adhered directly to the top first die surface; and
   a second adhesive region on and adhered directly to the top first die surface and the first adhesive region, and adhered directly to the bottom second die surface.

10. The semiconductor device of claim 9, wherein the first adhesive region comprises a first adhesive, and the second adhesive region comprises a second adhesive different from the first adhesive.

11. The semiconductor device of claim 10, wherein the first adhesive has a higher modulus than the second adhesive.

12. The semiconductor device of claim 1, wherein the second semiconductor die comprises a micro electro-mechanical systems (MEMS) device and the MEMS device comprises a through-hole.

13. The semiconductor device of claim 12, comprising a cover adhered to the substrate and covering the first semiconductor die, the adhesive regions and the second semiconductor die, wherein the cover comprises a through-hole.

14. The semiconductor device of claim 1, wherein the first semiconductor die is electrically connected to the substrate by conductive bumps positioned directly between the first semiconductor die and the substrate, and the second semiconductor die is electrically connected to the substrate by conductive wires.

15. A semiconductor device comprising:
   a substrate;
   a first semiconductor die having a top first die surface and a bottom first die surface, wherein the bottom first die surface is coupled to the substrate, and the first semiconductor die is electrically connected to the substrate;
   a plurality of adhesive regions spaced apart from each other on the top first die surface; and
   a second semiconductor die having a top second die surface and a bottom second die surface, wherein the bottom second die surface is adhered to the plurality of adhesive regions, and the second semiconductor die is electrically connected to the substrate,
   wherein each of the plurality of adhesive regions comprises:
      a first adhesive layer on and adhered to the top first die surface;
      a central layer comprising a central film on top of and adhered to the first adhesive layer; and
      a second adhesive layer on top of and adhered to the central layer, and adhered to the bottom second die surface.

16. The semiconductor device of claim 15, wherein the central layer comprises an elastomer.

17. The semiconductor device of claim 15, wherein the central layer has a lower modulus than the first and second adhesive layers.

18. A semiconductor device comprising:
   a first semiconductor die having a top first die surface;
   adhesive material on the top first die surface and comprising a plurality of volumes of the adhesive material separated from each other by a space; and
   a second semiconductor die having a bottom second die surface, wherein the bottom second die surface is adhered to the plurality of volumes of the adhesive material,
   wherein the adhesive material comprises the only material that is directly between the first and second semiconductor dies.

19. The semiconductor device of claim 18, wherein:
each of the volumes of the adhesive material comprises a first adhesive volume and a second adhesive volume, both of which are between the first and second semiconductor dies; and
each of the volumes of the adhesive material comprises only adhesive material and bridges an entire vertical gap between the top first die surface and the bottom second die surface.

20. The semiconductor device of claim 18, wherein there is no adhesive material connecting a first volume of the plurality of volumes of the adhesive material to a second volume of the plurality of volumes of the adhesive material.

21. A semiconductor device comprising:
a substrate;
a first semiconductor die having a top first die surface and a bottom first die surface, wherein the bottom first die surface is coupled to the substrate, and the first semiconductor die is electrically connected to the substrate;
a plurality of adhesive regions spaced apart from each other on the top first die surface; and
a second semiconductor die having a top second die surface and a bottom second die surface, wherein the bottom second die surface is adhered to the plurality of adhesive regions, and the second semiconductor die is electrically connected to the substrate
wherein each of the plurality of adhesive regions comprises:
a first adhesive region on and adhered to the top first die surface, the first adhesive region comprising a first adhesive; and
a second adhesive region on and adhered to the top first die surface and the first adhesive region, and adhered to the bottom second die surface, the second adhesive region comprising a second adhesive different from the first adhesive.

22. The semiconductor device of claim 21, wherein the first adhesive has a higher modulus than the second adhesive.

* * * * *